United States Patent
Chen et al.

(10) Patent No.: US 9,443,587 B1
(45) Date of Patent: Sep. 13, 2016

(54) RESISTIVE MEMORY APPARATUS AND WRITING METHOD THEREOF

(71) Applicant: Winbond Electronics Corp., Taichung (TW)

(72) Inventors: Frederick Chen, Hsinchu County (TW); Meng-Hung Lin, Taichung (TW); Ping-Kun Wang, Taichung (TW); Shao-Ching Liao, Miaoli County (TW); Chuan-Sheng Chou, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/804,354

(22) Filed: Jul. 21, 2015

(51) Int. Cl.
*G11C 11/00* (2006.01)
*G11C 13/00* (2006.01)

(52) U.S. Cl.
CPC ... *G11C 13/0069* (2013.01); *G11C 2013/0076* (2013.01)

(58) Field of Classification Search
CPC .......... G11C 13/0004; G11C 13/0069; G11C 11/5678; G11C 13/0038; G11C 13/0064; G11C 2013/0078; G11C 11/56; G11C 13/0023; G11C 13/0033; G11C 13/004; G11C 13/0061; G11C 2013/0054

USPC .......... 365/148, 163, 189.09, 210, 158, 236, 365/210.1; 714/763, E11.032; 257/E27.004, 528

See application file for complete search history.

(56) References Cited

U.S. PATENT DOCUMENTS

| 8,300,449 B2 | 10/2012 | Lin et al. |
| 2016/0019951 A1* | 1/2016 | Park .................. G11C 13/0069 365/148 |

* cited by examiner

*Primary Examiner* — Thong Q Le
(74) *Attorney, Agent, or Firm* — Jianq Chyun IP Office

(57) ABSTRACT

A resistive memory apparatus and a writing method thereof are provided. In the method, logic data is received, and a corresponding resistive memory cell is selected. A logic level of the logic data is determined. When the logic data is in a first logic level, where a first reading current of the corresponding resistive memory cell is greater than a first reference current, a set pulse and a reset pulse are provided to the resistive memory cell during a writing period. When the logic data is in a second logic level, where a second reading current of the resistive memory cell is smaller than a second reference current, the reset pulse is provided to the resistive memory cell during the writing period. Polarities of the reset pulse and the set pulse are opposite.

20 Claims, 4 Drawing Sheets

Apply set pulse

Apply reset pulse

RESISTIVE MEMORY APPARATUS AND WRITING METHOD THEREOF

BACKGROUND OF THE INVENTION

1. Field of the Invention

The invention relates to a memory apparatus and a writing method thereof, and particularly relates to a resistive memory apparatus and a writing method thereof.

2. Description of Related Art

A non-volatile memory has an advantage that data stored therein is not disappeared after power off, so that it serves as a necessary memory element for maintaining a normal operation of many electronic products. Presently, a resistive random access memory (RRAM) is a kind of non-volatile memory positively developed in the industry, which has advantages of low write operation voltage, short write and erase time, long memory time, non-destructive reading, multi-state memory, simple structure and small occupation area, etc., and has a great application potential in personal computers and electronic equipment in the future.

Generally, the resistive random access memory can change a width of a filament path according to magnitude and polarity of an applied pulse voltage, so as to set a resistance value to a low resistance state (LRS) or a high resistance state (HRS) in a reversible and non-volatile manner to respectively represent stored data of different logic levels. For example, when data of logic 1 is written, a reset pulse can be applied to narrow the width of the filament path to achieve the HRS. When data of logic 0 is written, a set pulse with an opposite polarity can be applied to broaden the width of the filament path to achieve the LRS. In this way, when the data is read, the data of logic 1 or logic 0 can be read according to a reading current of a different magnitude generated under different resistance states.

However, when the data of logic 0 is written, the filament path in a variable resistance element may have a sharp contour after the set pulse is applied thereto, such that a filament path with an excessively large width at one end and an excessively small width at another end is formed, which results in a problem of electromigration (EM). To be specific, when a large current continuously flows through the variable resistance element, the narrower a place in the filament path is, the higher a current density at the place is, and the higher an electric field thereof is, which leads to a phenomenon that metal atoms move towards an electron flowing direction along grain boundaries of the variable resistance element itself. As the electromigration is continuously increased, the current density is accordingly increased to aggravate the situation. If the electromigration is too severe, the variable resistance element can be broken to form an open circuit, such that data cannot be correctly written.

SUMMARY OF THE INVENTION

The invention is directed to a resistive memory apparatus and a writing method thereof, by which data is able to be correctly written.

The invention provides a writing method of a resistive memory apparatus, which includes following steps. Logic data is received, and a corresponding resistive memory cell is selected. A logic level of the logic data is determined. When the logic data is in a first logic level, where a first reading current of the corresponding resistive memory cell is greater than a first reference current, a set pulse and a reset pulse are provided to the resistive memory cell during a writing period. Polarities of the reset pulse and the set pulse are opposite. When the logic data is in a second logic level, the reset pulse is typically provided to the resistive memory cell during the writing period, so as to generate a second reading current smaller than a second reference current when a reading voltage is applied to the resistive memory cell during a verification period. In case the reset pulse fails to generate the second reading current smaller than the second reference current, the set pulse is applied before re-applying the reset pulse.

The invention provides a resistive memory apparatus including a resistive memory cell array, a current verification unit and a control unit. The resistive memory cell array includes a plurality of resistive memory cells. The control unit is coupled to the resistive memory cell array. The control unit receives logic data, and selects a corresponding resistive memory cell from the resistive memory cells. The control unit determines a logic level of the logic data. When the logic data is in a first logic level, where a first reading current is greater than a first reference current, the control unit provides a set pulse and a reset pulse to the resistive memory cell during a writing period. Polarities of the reset pulse and the set pulse are opposite.

According to the above descriptions, in the exemplary embodiments of the invention, during the writing period, after the control unit provides the set pulse to the resistive memory cell, the control unit further provides the reset pulse to the resistive memory cell, so as to avoid the problem of electromigration caused by excessive narrow width of the filament path in the variable resistance element.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
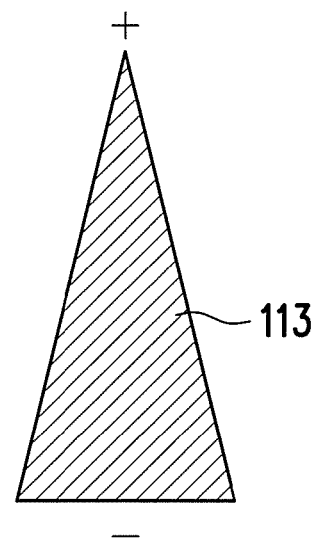
FIG. 1 is a schematic diagram of a variable resistance element when a set pulse is applied to a resistive memory cell according to an embodiment of the invention.
Figure 2:
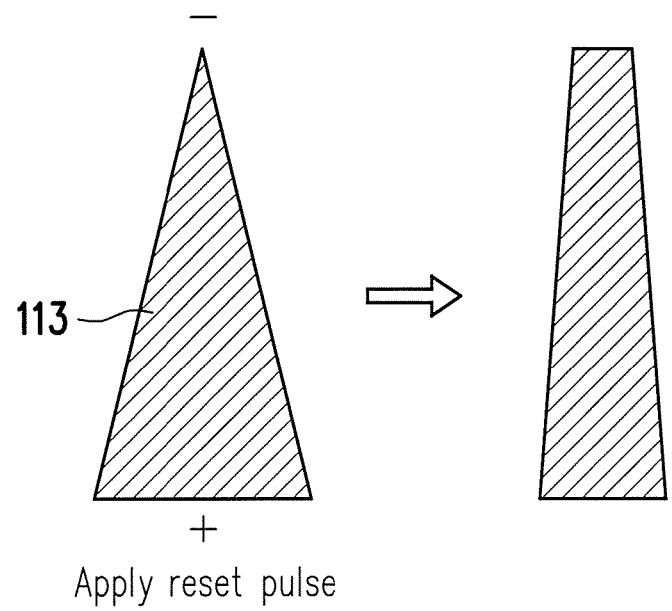
FIG. 2 is a schematic diagram of a variable resistance element when a set pulse and a reset pulse are applied to a resistive memory cell according to an embodiment of the invention.

FIG. 1 is a schematic diagram of a variable resistance element when a set pulse is applied to a resistive memory cell according to an embodiment of the invention. FIG. 2 is a schematic diagram of a variable resistance element when a set pulse and a reset pulse are applied to a resistive memory cell according to an embodiment of the invention. Referring to FIG. 1 and FIG. 2, during a writing period, a resistive memory apparatus can apply a set pulse with a positive polarity to form a low resistance state to store data of; for example, logic 0. When the data is read, a reading current corresponding to different resistance state can be used to identify the resistance state thereof; so as to correctly read the data of logic 0. However, according to FIG. 1, it is known that when the data of logic 0 is written, a filament path of a variable resistance element 113 may have a sharp contour after the set pulse is applied thereto, such that a filament path with an excessively large width at one end and an excessively small width at another end is formed, which results in a problem of electromigration (EM). In another embodiment of the invention, after a control unit provides the set pulse to the resistive memory cell, the control unit further provides a reset pulse to the resistive memory cell to change the contour of the variable resistance element 113, such that one end of the filament path with excessively small width can be broadened, so as to mitigate the problem of electromigration, as shown in FIG. 2.

Implementation of the resistive memory apparatus and a writing method thereof of the invention are described below.

Figure 3:
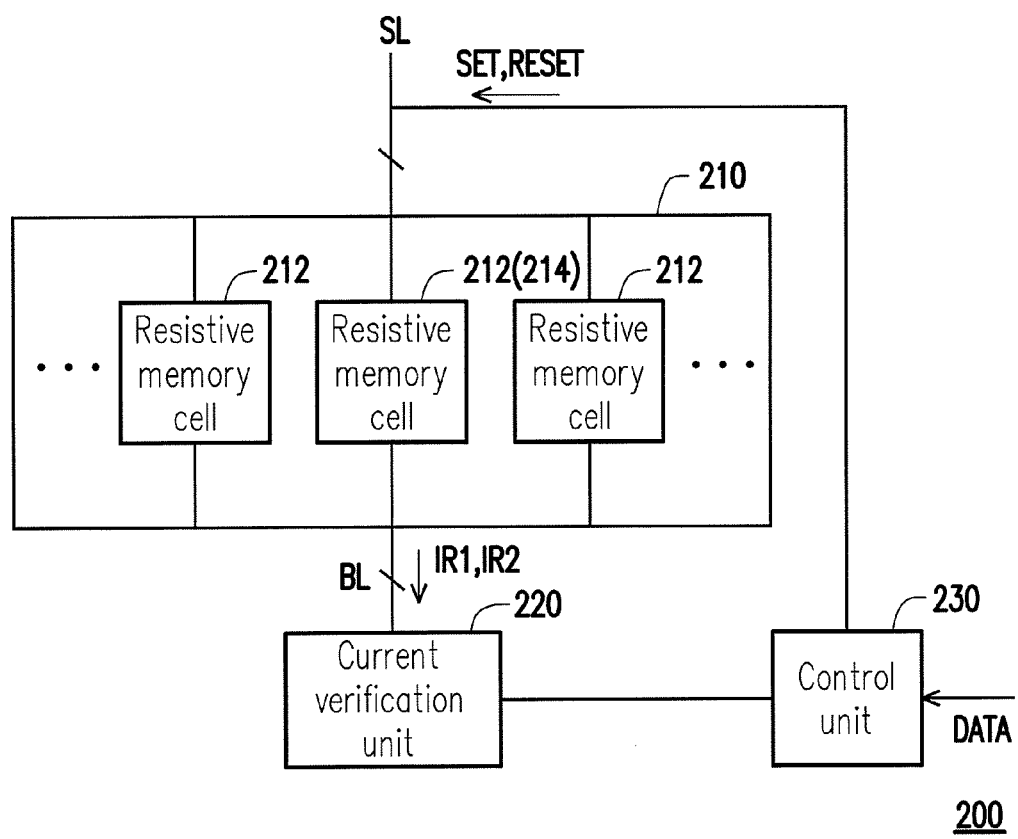
FIG. 3 is a schematic diagram of a resistive memory apparatus according to an embodiment of the invention.

FIG. 3 is a schematic diagram of a resistive memory apparatus according to an embodiment of the invention. Referring to FIG. 3, the resistive memory apparatus 200 includes a resistive memory cell array 210, a current verification unit 220 and a control unit 230. The resistive memory cell array 210 includes a plurality of resistive memory cells 212. The resistive memory cell array 210 are coupled to the current verification unit 220 through a plurality of bit lines BL, and are coupled to the control unit 230 through a plurality of source lines SL. Each of the resistive memory cells 212 may include a switch element, for example, a metal oxide semiconductor field effective transistor (MOSFET) or a bipolar junction transistor, and a variable resistance element, and each of the resistive memory cells 212 can provide stored data of a single bit.

The current verification unit 220 can be any type of a current measuring element/circuit, for example, a sensing amplifier circuit. The current verification unit 220 can be coupled to the resistive memory cells 212 through a plurality of the bit lines BL. The current verification unit 220 is configured to verify that reading currents generated by the resistive memory cells 212 are complied with a predetermined reference current when logic data is written into the resistive memory cells 212 to indicate that the control unit 230 correctly writes the logic data into the resistive memory cells 212.

The control unit 230 is, for example, a central processing unit (CPU), a microprocessor, a digital signal processor (DSP), a programmable controller, a programmable logic device (PLD) or other similar devices or a combination of the above devices. The control unit is coupled to the current verification unit 220 and a plurality of the source lines SL of the resistive memory cell array 210. Detailed steps of a writing method of the resistive memory apparatus 200 are described below with reference of an embodiment.

Figure 4:
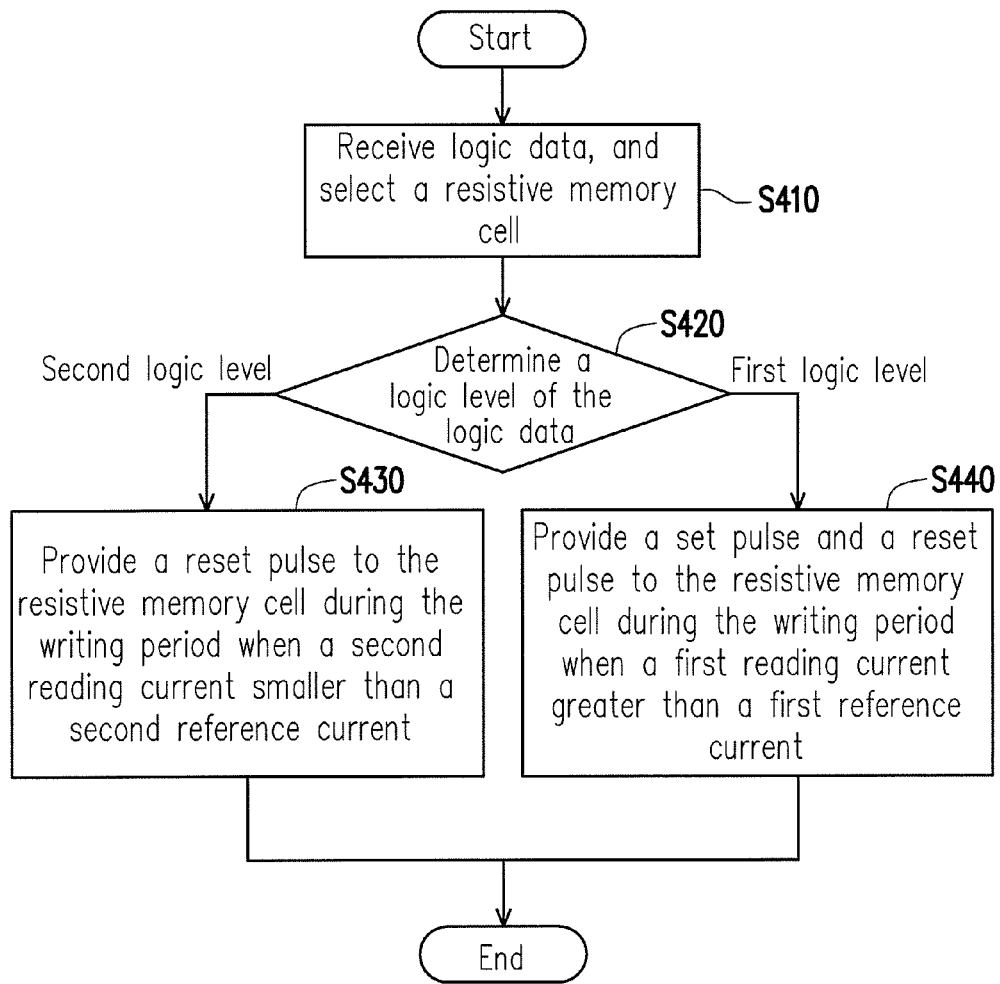
FIG. 4 is a flowchart illustrating a writing method of a resistive memory apparatus according to an embodiment of the invention.

FIG. 4 is a flowchart illustrating a writing method of a resistive memory apparatus according to an embodiment of the invention. Referring to FIG. 3 and FIG. 4, the method for writing logic data of the present embodiment is at least adapted to the resistive memory apparatus 200 of FIG. 3, and detailed steps of the writing method of the present embodiment are described below with reference of various components in the resistive memory apparatus 200.

In step S410, the control unit 230 receives logic data DATA, and selects a corresponding resistive memory cell 212. To be specific, when the control unit 230 receives the logic data DATA of a single bit, the control unit 230 selects a corresponding resistive memory cell 214 from the resistive memory cells 212. In the present embodiment, the resistive memory cell 214 includes a switch element and a variable resistance element, for example, the variable resistance element 113 shown in FIG. 1. The control unit 230, for example, provides a selecting voltage to a gate (or a base) of a transistor serving as the switch element in the resistive memory cell 214 to turn on the transistor, so as to perform a subsequent data writing operation to the resistive memory cell 214.

In step S420, the control unit 230 determines a logic level of the logic data DATA. To be specific, the control unit 230 can determine the logic data DATA of the single bit to be in logic 1 or logic 0.

When the logic data DATA is in logic 1 (i.e., a second logic level), in step S430, the control unit 230 provides a reset pulse RESET to the resistive memory cell 214 during a writing period. During a verification period, when the control unit 230 applies a reading voltage to the resistive memory cell 214, the resistive memory cell 214 generates a second reading current IR2 smaller than a second reference current, and outputs the same to the current verification unit 220 for verification. In other words, the control unit 230 provides the reset pulse RESET to the resistive memory cell 214 during the writing period when the second reading current IR2 is smaller than the second reference current. In an embodiment, if the second reading current IR2 generated by the resistive memory cell 214 does not pass through the verification of the current verification unit 220, the control unit 230, for example, further provides a set pulse SET to the resistive memory cell 214, such that the resistive memory cell 214 generates the second reading current IR2 smaller than the second reference current. In the present embodiment, the control unit 230 repeatedly and sequentially provides the reset pulse RESET and the set pulse SET to the resistive memory cell 214 during a reset operation period, such that the second reading current IR2 generate by the resistive memory cell 214 can pass through the verification of the current verification unit 220.

On the other hand, when the logic data DATA is in logic 0 (i.e., a first logic level), in step S440, the control unit 230 provides the set pulse SET and the reset pulse RESET to the resistive memory cell 214 during the writing period. During the verification period, when the control unit 230 applies the reading voltage to the resistive memory cell 214, the resistive memory cell 214 generates a first reading current IR1 greater than a first reference current. In other words, the control unit 230 provides the set pulse SET and the reset pulse RESET to the resistive memory cell 214 during the writing period when the first reading current IR1 is greater than the first reference current. In the present embodiment, the control unit 230 repeatedly and sequentially provides the set pulse SET and the reset pulse RESET to the resistive memory cell 214 during a set operation period, such that the first reading current IR1 generate by the resistive memory cell 214 can pass through the verification of the current verification unit 220. Therefore, according to the writing method of the present embodiment, during the writing period, by sequentially providing the set pulse SET and the reset pulse RESET to the resistive memory cell 214, the contour of the variable resistance element 113 can be changed, such that one end of the filament path with excessively small width therein can be broadened, so as to mitigate the problem of electromigration.

In the present embodiment, the second reference current and the first reference current are, for example, determined by a reference current generated by applying the reading voltage to the resistive memory cell 214 with a resistance value of zero, and setting values of the second reference current and the first reference current can be the same or different, which is not limited by the invention. Moreover, in the present embodiment, the reset pulse is, for example, a pulse with a negative polarity, and the set pulse is, for example, a pulse with a positive polarity, and polarities thereof are opposite.

Moreover, in the present embodiment, the control unit 230 writes the logic data DATA into the corresponding resistive memory cell 214 during the writing period. In the writing process, the current verification unit 220 verifies the reading current during the verification period, so as to ensure correctness of data writing. Therefore, the writing period of the present embodiment includes the verification period, and after the logic data DATA written into the resistive memory cell 214 is verified by the current verification unit 220, it represents that the data is successfully written to complete the writing operation.

In order to fully convey the spirit of the invention to those skilled in the art, another embodiment is provided below for further description.

Figure 5:
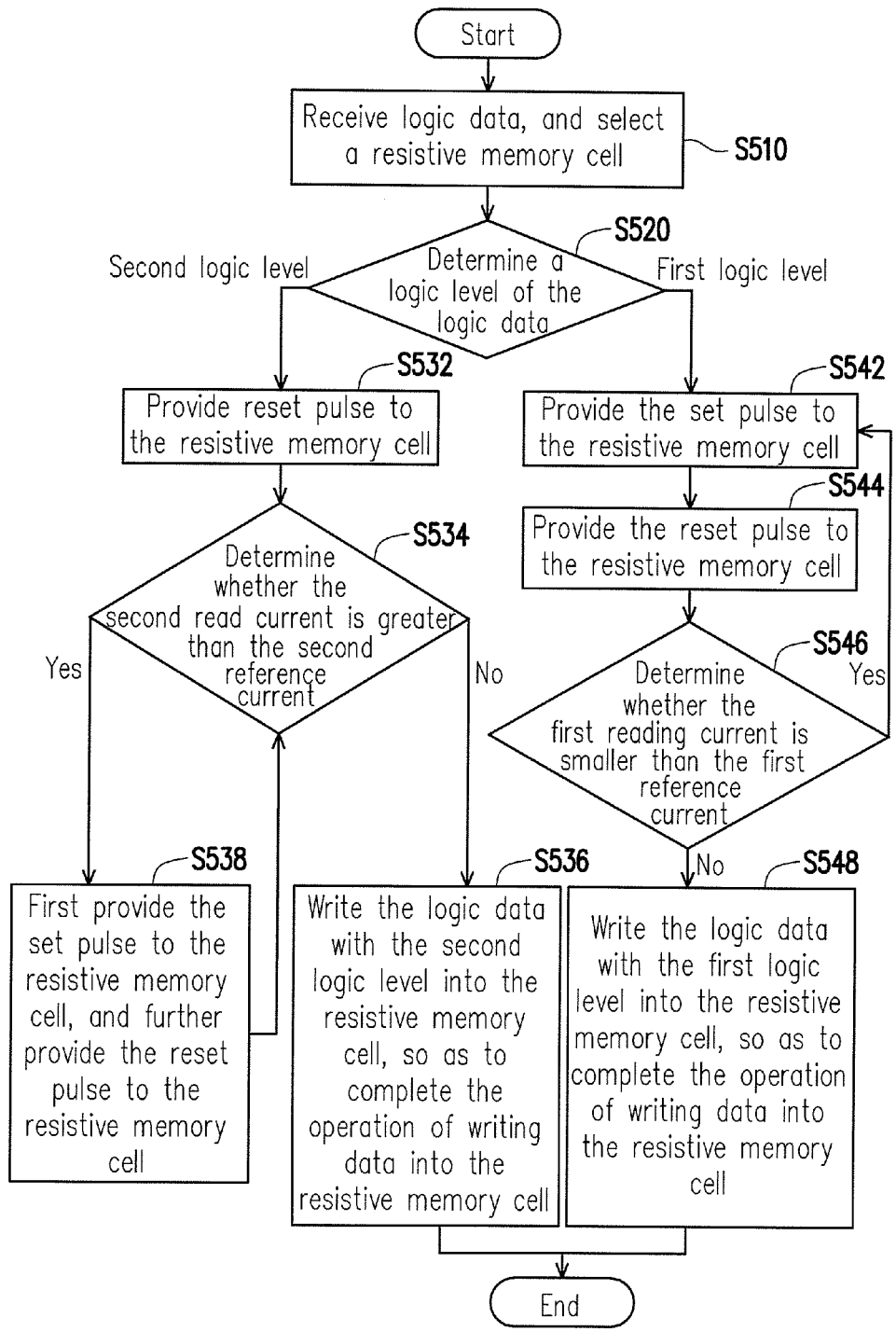
FIG. 5 is a flowchart illustrating a writing method of a resistive memory apparatus according to another embodiment of the invention.

FIG. 5 is a flowchart illustrating a writing method of a resistive memory apparatus according to another embodiment of the invention. Referring to FIG. 3 and FIG. 5, the method writing logic data of the present embodiment is at least adapted to the resistive memory apparatus 200 of FIG. 3, and detailed steps of the writing method of the present embodiment are described below with reference of various components in the resistive memory apparatus 200.

In step S510, the control unit 230 receives the logic data DATA, and selects the corresponding resistive memory cell 214. In step S520, the control unit 230 determines the logic level of the logic data DATA. The steps S510 and S520 are the same or similar to the steps S410 and S420 of the embodiment of FIG. 4, so that details thereof are not repeated.

Then, in the present embodiment, when the logic data DATA is in the logic 1 (i.e., the second logic level), in step S532, the control unit 230 provides the reset pulse RESET to the resistive memory cell 214. In step S534, the current verification unit 220 determines whether the second reading current IR2 is greater than the second reference current. If not, i.e., the second reading current IR2 is smaller than or equal to the second reference current, it represents that the second reading current IR2 passes through the verification, and a step S536 is executed. In the step S536, the control unit 230 writes the logic data of the second logic level into the resistive memory cell 214 to complete the operation of writing data into the resistive memory cell 214.

On the other hand, if the second reading current IR2 is greater than the second reference current, it represents that the second reading current IR2 does not pass through the verification, and a step S538 is executed. In the step S538, the control unit 230 first provides the set pulse SET to the resistive memory cell 214. In order to mitigate the problem of electromigration, after providing the set pulse SET to the resistive memory cell 214, the control unit 230 further provides the reset pulse RESET to the resistive memory cell 214 to make the second reading current IR2 to be smaller than or equal to the second reference current, such that the second reading current IR2 can pass through the verification of the current verification unit 220. In other words, if the second reading current IR2 is greater than the second reference current, the logic data writing method of the present embodiment repeatedly executes the step S534 and the step S536, such that the current verification unit 220 determines whether the second reading current IR2 is greater than the second reference current, and the control unit 230 provides the set pulse SET and the reset pulse RESET to the resistive memory cell 214 until the second reading current IR2 is smaller than or equal to the second reference current to pass through the verification of the current verification unit 220.

According to another aspect, in the step S532 to the step S536, the control unit 230 repeatedly and sequentially provides the reset pulse RESET and the set pulse SET to the resistive memory cell 214 during the reset operation period, such that the second reading current IR2 generate by the resistive memory cell 214 can pass through the verification of the current verification unit 220. Moreover, in the step S538, after providing the set pulse SET to the resistive memory cell 214, the control unit 230 further provides the reset pulse RESET to the resistive memory cell 214 to mitigate the problem of electromigration.

Then, in the present embodiment, when the logic data DATA is in logic 0 (i.e., the first logic level), in step S542, the control unit 230 first provides the set pulse SET to the resistive memory cell 214. In order to mitigate the problem of electromigration, in step S544, after providing the set pulse SET to the resistive memory cell 214, the control unit 230 further provides the reset pulse RESET to the resistive memory cell 214. Then, in step S546, the current verification unit 220 determines whether the first reading current IR1 is smaller than the first reference current. If not, i.e., the first reading current IR1 is greater than or equal to the second reference current, it represents that the first reading current IR1 passes through the verification, and a step S548 is executed. In the step S548, the control unit 230 writes the logic data with the first logic level into the resistive memory cell 214 to complete the operation of writing data into the resistive memory cell 214.

On the other hand, if the generate first reading current IR1 is smaller than the first reference current, it represents that the first reading current IR1 does not pass through the verification, and the method flow returns to the step S542, by which the control unit 230 again provides the set pulse SET to the resistive memory cell 214. In other words, if the first reading current IR1 is smaller than the first reference current, the logic data writing method of the present embodiment repeatedly executes the step S542 to the step S546, such that the control unit 230 provides the set pulse SET and the reset pulse RESET to the resistive memory cell 214, and the current verification unit 220 determines whether the first reading current IR1 is smaller than the first reference current until the first reading current IR1 is greater than or equal to the first reference current to pass through the verification of the current verification unit 220.

Therefore, in the step S542 to the step S546, the control unit 230 repeatedly and sequentially provides the set pulse SET and the reset pulse RESET to the resistive memory cell 214 during the set operation period, such that the first reading current IR1 generate by the resistive memory cell 214 can pass through the verification of the current verification unit 220. Moreover, in the step S542 and the step S544, after providing the set pulse SET to the resistive memory cell 214, the control unit 230 further provides the reset pulse RESET to the resistive memory cell 214 to mitigate the problem of electromigration.

Moreover, since those skilled in the art can learn enough instructions and recommendations for the writing method of the resistive memory apparatus of the present embodiment from the descriptions of the embodiments of FIG. 1 to FIG. 4, detailed description thereof is not repeated.

In summary, in the exemplary embodiment of the invention, during the reset operation period, the control unit repeatedly and sequentially provides the reset pulse and the set pulse to the resistive memory cell. Alternatively, during the set operation period, the control unit repeatedly and sequentially provides the set pulse and the reset pulse to the resistive memory cell. Therefore, after providing the set pulse to the resistive memory cell, the control unit further provides the reset pulse to the resistive memory cell, so as to avoid excessive narrowing of the filament path in the variable resistance element to cause the problem of electromigration. Therefore, the resistive memory apparatus and the writing method thereof provided by the exemplary embodiments of the invention can correct write data.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A writing method of a resistive memory apparatus, comprising:
   receiving logic data, and selecting a corresponding resistive memory cell;
   determining a logic level of the logic data;
   when the logic data is in a first logic level, where a first reading current of the corresponding resistive memory cell is greater than a first reference current, providing a set pulse and a reset pulse to the resistive memory cell during a writing period, wherein polarities of the reset pulse and the set pulse are opposite.

2. The writing method of the resistive memory apparatus as claimed in claim 1, wherein when the logic data is in the first logic level, the step of providing the set pulse and the reset pulse to the resistive memory cell during the writing period comprises:
   providing the set pulse to the resistive memory cell; and
   providing the reset pulse to the resistive memory cell after providing the set pulse to the resistive memory cell.

3. The writing method of the resistive memory apparatus as claimed in claim 2, wherein when the logic data is in the first logic level, during the writing period, the writing method of the resistive memory apparatus further comprises:
   determining whether the first reading current is smaller than the first reference current; and
   providing the set pulse and the reset pulse to the resistive memory cell when the first reading current is smaller than the first reference current.

4. The writing method of the resistive memory apparatus as claimed in claim 3, wherein when the logic data is in the first logic level, during the writing period, the writing method of the resistive memory apparatus further comprises:
   writing the logic data with the first logic level into the resistive memory cell when the first reading current is greater than or equal to the first reference current.

5. The writing method of the resistive memory apparatus as claimed in claim 3, wherein when the first reading current is smaller than the first reference current, the step of determining whether the first reading current is smaller than the first reference current and the step of providing the set pulse and the reset pulse to the resistive memory cell are repeatedly executed until the first reading current is greater than or equal to the first reference current.

6. The writing method of the resistive memory apparatus as claimed in claim 1, further comprising:
   when the logic data is in a second logic level, where a second reading current of the resistive memory cell is smaller than a second reference current, providing the reset pulse to the resistive memory cell during the writing period; and
   when the logic data is in the second logic level, where the second reading current greater is than the second reference current, further providing the set pulse to the resistive memory cell during the writing period.

7. The writing method of the resistive memory apparatus as claimed in claim 6, wherein when the logic data is in the second logic level, during the writing period, the writing method of the resistive memory apparatus further comprises:
   determining whether the second reading current is greater than the second reference current; and
   providing the set pulse and the reset pulse to the resistive memory cell when the second reading current is greater than the second reference current.

8. The writing method of the resistive memory apparatus as claimed in claim 7, wherein when the logic data is in the second logic level, during the writing period, the writing method of the resistive memory apparatus further comprises:
   writing the logic data with the second logic level into the resistive memory cell when the second reading current is smaller than or equal to the second reference current.

9. The writing method of the resistive memory apparatus as claimed in claim 7, wherein when the second reading current is greater than the second reference current, the step of providing the set pulse and the reset pulse to the resistive memory cell comprises:
   providing the set pulse to the resistive memory cell; and
   providing the reset pulse to the resistive memory cell after providing the set pulse to the resistive memory cell.

10. The writing method of the resistive memory apparatus as claimed in claim 7, wherein when the second reading current is greater than the second reference current, the step of determining whether the second reading current is greater than the second reference current and the step of providing the set pulse and the reset pulse to the resistive memory cell are repeatedly executed until the second reading current is smaller than or equal to the second reference current.

11. A resistive memory apparatus, comprising:
    a resistive memory cell array, comprising a plurality of resistive memory cells; and
    a control unit, coupled to the resistive memory cell array, wherein the control unit receives logic data; the control unit selects a corresponding resistive memory cell from the resistive memory cells; the control unit determines a logic level of the logic data; and when the logic data is in a first logic level, where a first reading current of the corresponding resistive memory cell is greater than a first reference current, the control unit provides a set pulse and a reset pulse to the resistive memory cell during a writing period, wherein polarities of the reset pulse and the set pulse are opposite.

12. The resistive memory apparatus as claimed in claim 11, wherein when the logic data is in the first logic level, during the writing period, the control unit provides the set pulse to the resistive memory cell, and provides the reset pulse to the resistive memory cell after providing the set pulse to the resistive memory cell.

13. The resistive memory apparatus as claimed in claim 12, wherein when the logic data is in the first logic level, during the writing period, the current verification unit determines whether the first reading current is smaller than the first reference current, and when the first reading current is smaller than the first reference current, the control unit provides the set pulse and the reset pulse to the resistive memory cell.

14. The resistive memory apparatus as claimed in claim 13, wherein when the logic data is in the first logic level, during the writing period, when the first reading current is greater than or equal to the first reference current, the control unit writes the logic data with the first logic level into the resistive memory cell.

15. The resistive memory apparatus as claimed in claim 13, wherein when the first reading current is smaller than the first reference current, the current verification unit determines whether the first reading current is smaller than the first reference current, and the control unit provides the set pulse and the reset pulse to the resistive memory cell until the first reading current is greater than or equal to the first reference current.

16. The resistive memory apparatus as claimed in claim 11, wherein when the logic data is in a second logic level, where a second reading current of the resistive memory cell smaller is than a second reference current, the control unit provides a reset pulse to the resistive memory cell during a writing period; and when the logic data is in the second logic level, where the second reading current is greater than the second reference current, the control unit further provides the set pulse to the resistive memory cell during the writing period.

17. The resistive memory apparatus as claimed in claim 16, wherein when the logic data is in the second logic level, during the writing period, the current verification unit determines whether the second reading current is greater than the second reference current, and when the second reading current is greater than the second reference current, the control unit provides the set pulse and the reset pulse to the resistive memory cell.

18. The resistive memory apparatus as claimed in claim 17, wherein when the logic data is in the second logic level, during the writing period, when the second reading current is smaller than or equal to the second reference current, the control unit writes the logic data with the second logic level into the resistive memory cell.

19. The resistive memory apparatus as claimed in claim 17, wherein when the second reading current is greater than the second reference current, the control unit provides the set pulse to the resistive memory cell, and provides the reset pulse to the resistive memory cell after providing the set pulse to the resistive memory cell.

20. The resistive memory apparatus as claimed in claim 17, wherein when the second reading current is greater than the second reference current, the current verification unit determines whether the second reading current is greater than the second reference current, and the control unit provides the set pulse and the reset pulse to the resistive memory cell until the second reading current is smaller than or equal to the second reference current.

* * * * *